United States Patent
Andreev et al.

(10) Patent No.: US 6,505,336 B1
(45) Date of Patent: Jan. 7, 2003

(54) CHANNEL ROUTER WITH BUFFER INSERTION

(75) Inventors: Alexander E. Andreev, San Jose, CA (US); Pedja Raspopovic, Cupertino, CA (US); Anatoli A. Bolotov, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 91 days.

(21) Appl. No.: 09/804,939

(22) Filed: Mar. 13, 2001

(51) Int. Cl.[7] .............................................. G06F 17/50
(52) U.S. Cl. ........................................... 716/14; 716/12
(58) Field of Search ..................................... 716/12–14

(56) References Cited

U.S. PATENT DOCUMENTS 6,453,444 B1 * 9/2002 Shepard ......................... 716/2

OTHER PUBLICATIONS

A new toroidal mutli–domensional network Lee etal. IEEE Catalog No.: 97CH36074.*

* cited by examiner

Primary Examiner—Cuong Quang Nguyen
(74) Attorney, Agent, or Firm—Westman, Champlin & Kelly

(57) ABSTRACT

Channels are routed in an integrated circuit layout by reserving grid positions for buffers. Cell pins are identified at different y-coordinates to be connected by the channel. A determination is made as to the necessity of a jog between vertical segments, and if so, a y-coordinate is assigned to each such jog. An x-coordinate is assigned to each channel segment extending across the y-coordinates. Y-coordinates are assigned to buffers to be connected to the channel.

18 Claims, 2 Drawing Sheets

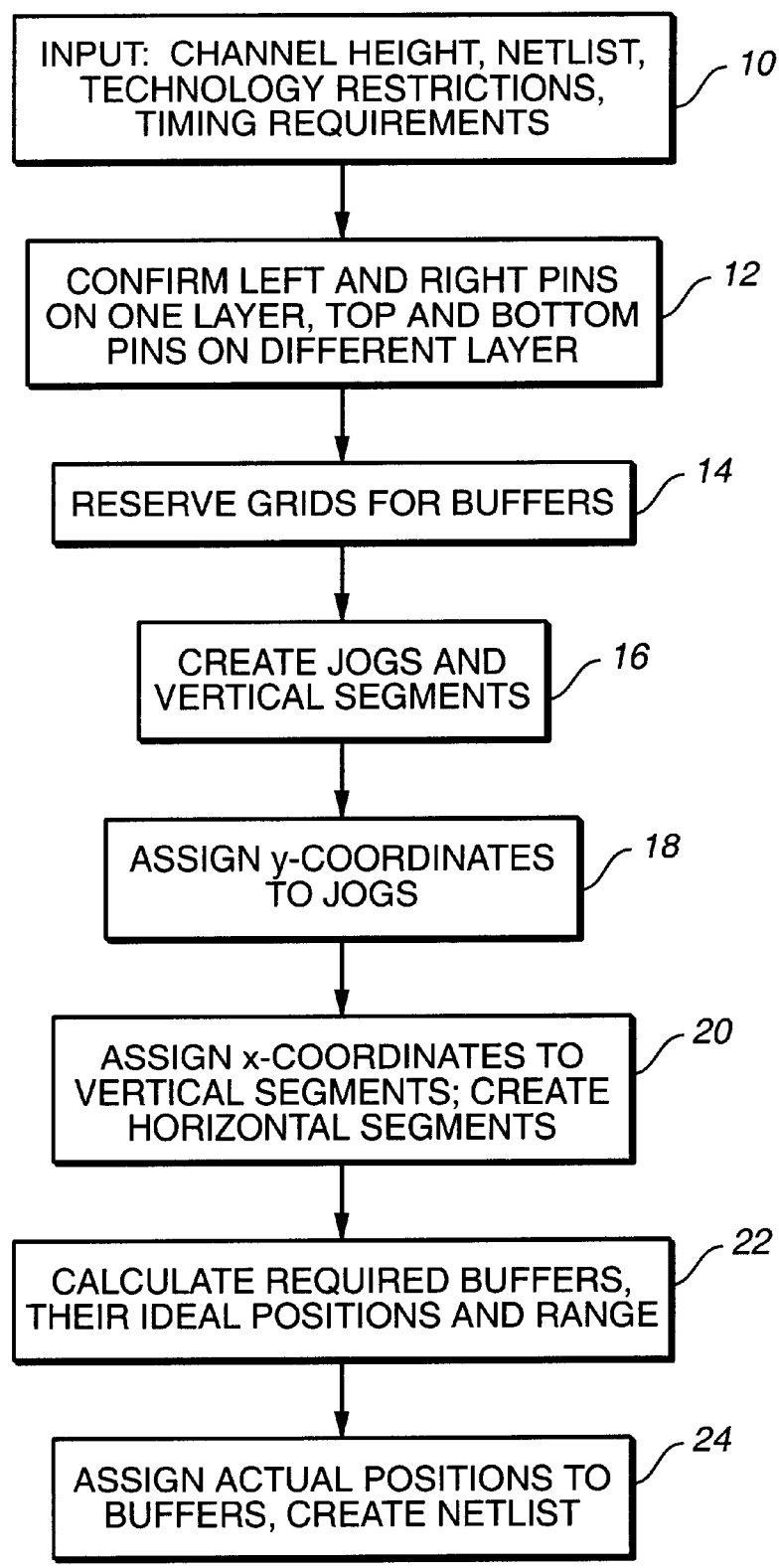
FIG._1

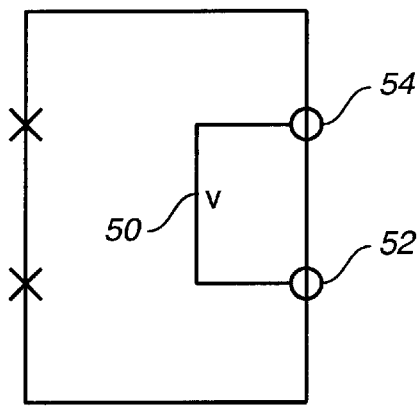
FIG._2
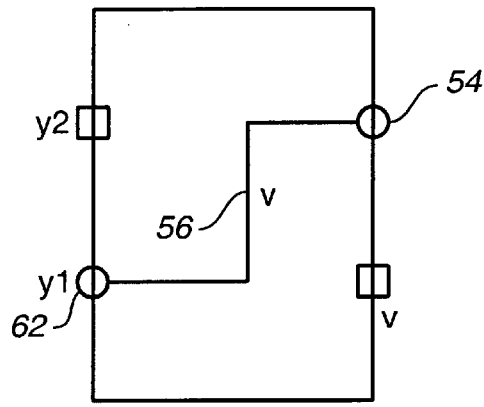
FIG._3
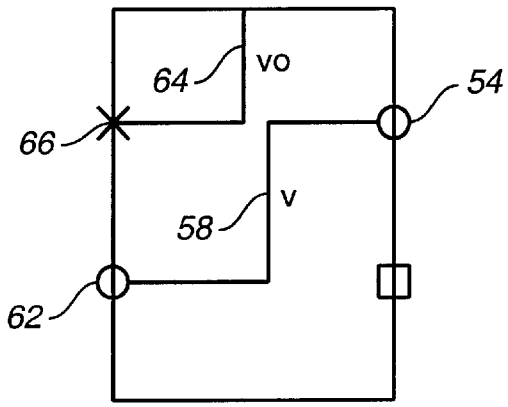
FIG._4
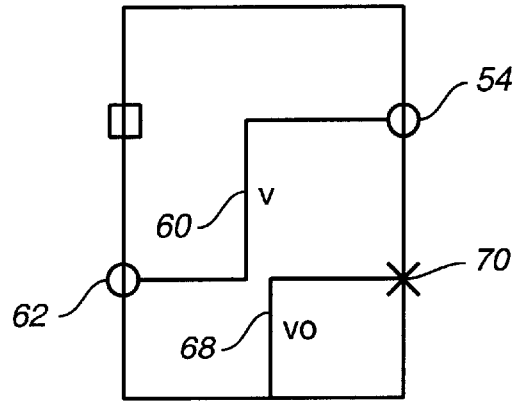
FIG._5
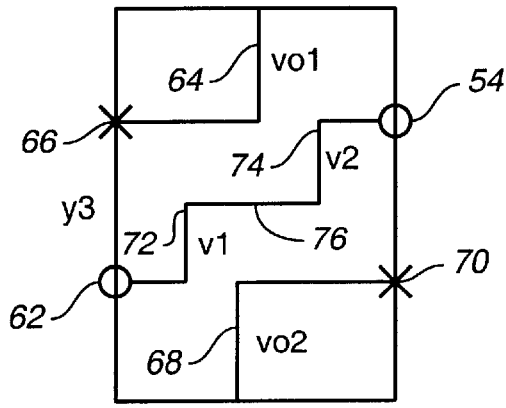
FIG._6

CHANNEL ROUTER WITH BUFFER INSERTION

FIELD OF THE INVENTION

This invention relates to integrated circuits, and particularly to routing channels in integrated circuit chips. The invention is particularly useful in connection with fabrication of integrated circuit chips whose netlist is transmitted electronically by a customer to the IC foundry.

BACKGROUND OF THE INVENTION

Integrated circuits are typically composed of cells that are defined by netlists. The netlist defines the function of the cell, timing requirements and other factors associated with the fabrication of the integrated circuit chip. In most cases, channel size and pin function are defined by the netlist, taking into account technology restrictions of the fabrication process. Consequently, when developing the netlist, the IC designer selects the size of the channel, and any specialized timing considerations (including buffers) that may be required.

In some cases, the IC designer may not have full knowledge of the technology restrictions in connection with the fabrication of the integrated circuit chip. It is common, for example, for equipment manufacturers to design integrated circuit chips for use in their equipment and develop netlists of those chips. The netlists are then transmitted to the IC fabricator where modifications may be necessary to accommodate proprietary technology restrictions. This often means the chip designer and fabricator must coordinate efforts to modify the designer's netlists to accommodate the technology of the fabrication.

One area of chip fabrication requiring close coordination between the designer and the fabrication requirements lies in the area of channel definition and timing. Considerable time and effort are directed to channel definition. Moreover, even where the designer is fully knowledgeable of fabrication restrictions, complexities of channel design often render development of netlists that include channel design to be tedious. There is, accordingly, a need for a technique that automates the channel definition and timing to alter the original netlist for meeting fabrication requirements.

SUMMARY OF THE INVENTION

The present invention provides a technique to create channel routing of a channel and to insert buffers as may be necessary to accommodate timing requirements.

The present invention provides a process for routing channels in an integrated circuit layout. Input are definitions of (1) a grid having first and second orthogonal coordinate types, (2) netlists, (3) a channel dimension defined by coordinated of a first type, (4) timing requirements, and (5) technology restrictions for a plurality of cells of the integrated circuit. Grid positions are reserved for buffers. Pins of a cell are identified at different coordinates of the first type, such as at different y-coordinates, to be connected by the channel. A determination is made as to the necessity of a jog between vertical segments, and if so, a coordinate of the first type, such as a y-coordinate, is assigned to each such jog. A coordinate of the second type, such as an x-coordinate, is assigned to each channel segment extending across the y-coordinates. Coordinates of the first type, such as y-coordinates, are assigned to buffers to be connected to the channel.

In preferred embodiments, the necessity for jogs is determined by identifying whether pins of other netlists have the same coordinates, such as y-coordinates, as two pins on opposite sides of the channel of the cell under consideration. Coordinates are assigned to channel segments in accordance with technology restrictions, such as spacing, for the channel segments and jog.

In other preferred embodiments, coordinates are assigned to buffers for the channel by identifying if a segment extending along the y-direction crosses a coordinate of a reserved grid. If so, a buffer is coupled to the segment. If the segment does not cross the coordinate of the reserved buffer, the segment is extended to the coordinate of the reserved buffer, and a penalty is assigned to each extended segment. The buffers and segments are ordered to minimize the total penalty.

According to another aspect of the invention, a computer usable medium contains a computer readable program comprising code that causes a computer to define channel routing with buffer connections.

BRIEF DESCRIPTION OF THE DRAWINGS

FIG. 1 is a flow chart of the process in accordance with the presently preferred embodiment of the present invention.

FIGS. 2–6 illustrate certain examples in connection with the process of FIG. 1.

DETAILED DESCRIPTION OF THE PREFERRED EMBODIMENTS

Referring to FIG. 1, the process commences at step 10 by inputting data into a computer that will calculate the position of channels and buffers. The input data consists of the input netlist of the cells of the IC chip being fabricated, including channel height, pin allocation and timing requirements. Also input are the rules associated with technology restrictions, including grid size and spacing rules. For each pin in the netlist, a pointer identifies the net to which it belongs and the metal layer in which it is located. Pins may be on the left, right, top and bottom of the cell, and are flagged as such. For purposes of the present invention, pins to the left and right have a y-coordinate but no x-coordinate, and pins on the top and bottom edges have no coordinates. Further, no cell may have more than one pin at the top edge and one pin at the bottom edge. In most cases, the top and bottom pin(s) are in single metal layer, different from the metal layer containing the left and right pin(s), which are also usually in a single metal layer.

The present invention will be described with the assumption that the channel is vertical, as opposed to horizontal, that is, it extends along the y-direction, crossing the x-coordinates. Analogous input and procedures may be performed should the channel be horizontal (along the x-direction).

At step 12, a test is conducted to confirm that the left and right pins are associated with one layer and that all top and bottom pins are associated with a different layer. If this is not the case, it will be necessary to create small channels around the routing channel to provide metal vias to the proper layer. For the purposes of the present invention, horizontal wires (x-direction) will be placed on the same layer as the left and the right pins, and vertical wires (y-direction) will be placed on the same layer as top and bottom pins. These assignments may be reversed, if desired.

At step 14, grids are reserved for connection to buffers that will be inserted to break long vertical wires. Since the horizontal wires are on the same layer as the left and right pins, the reservation of grids for the horizontal wires is accomplished on that layer in locations where there are no pins. At step 16, jogs and vertical segments are established for the channel. This is accomplished on a net-by-net basis by placing the pins of the nets in order, such as from bottom to top. Where two pins have different y-coordinates, at least one vertical segment will be created between them. If two or more vertical segments are necessary, one or more horizontal jogs between the vertical segments will be necessary.

FIGS. 2–6 illustrate five examples of locating the vertical segments. In each of FIGS. 2–6, a circle identifies the position-of a pin of the current net, a square represents the location of a free spot where a pin may be positioned, and an "X" identifies the position of a pin of another net.

In FIG. 2, pins 52 and 54 to be connected are both on the same side of the channel and at different y-coordinates (y1 and y2, respectively), meaning that a single vertical segment 50 is adequate to interconnect the pins. In FIGS. 3, 4 and 5, a single segment 56 (FIG. 3), 58 (FIG. 4) and 60 (FIG. 5) couples pin 62 (at y1 coordinate) on the left side of the channel to pin 54 (at y2 coordinate) on the right side of the channel. In FIG. 4, a segment 64 of a different net is coupled to pin 66 to the left of pin 54. Consequently, vertical segment 58 must be to the right of segment 64 by an amount based on technology spacing rules. Similarly, in FIG. 5, segment 68 of a different net is coupled to pin 70 to the right of pin 62, so vertical segment 60 must be to the left of segment 66 by the design amount.

FIG. 6 illustrates the situation of a combination of FIGS. 4 and 5 where segments 64 and 68 of other nets are to the left and right of pins 62 and 54, respectively, of the current net. In this case, two vertical segments 72 and 74 are coupled together by jog 76 for connection between pins 62 and 54, so that vertical segment 72 is a design distance from segment 68 and vertical segment 74 is a design distance from segment 64.

An inspection of FIGS. 2–6 reveals the constraints on the placement of vertical segments in the channel. In FIGS. 2 and 3, there are no other nets that will interfere with the placement of the vertical segment, so segment 50 or 56 may be placed anywhere in the channel. However, in the case of FIG. 2, since both pins are on the same side, it is desirable to maintain the position of segment 50 as close as practical to pins 52 and 54 to minimize channel length. In the example of FIG. 6, jog 76 is necessary because pin 70 of the other net is at the same y-coordinate as pin 62 of the net under consideration, and pin 66 of another net is at the same y-coordinate as pin 52 as the net under consideration. Consequently, a jog is necessary only if the right and left pins are on opposite sides of the channel and if each has a pin of a different net on the other side of the horizontal grid line.

At step 18 in FIG. 1, y-coordinates are assigned to the horizontal jogs. Where a jog is necessary, as in the case of jog 76 in FIG. 6, it may be placed at the y-coordinate on any free grid that is not occupied by another pin or reserved for a buffer in step 14. It is preferred, however, that jog 76 is placed between the y-coordinates of pins 62 and 54: y1<y3<y2. The placement of the jog becomes an assignment problem of minimizing a penalty function based on placement of objects in boxes.

Treating the jogs as objects and the horizontal grid lines as boxes, the capacity of a grid line is "1" if it is a free line, that is, that has no pins and is not reserved for buffers. If the line is not free, it is assigned a "0". The penalty is 0 if the grid line (y-coordinate) for the jog is between those of the pins (i.e., y1<y3<y2). A penalty function is applied if the position of the y-coordinate of the jog is outside the y1, y2 interval, increasing the penalty the further the jog is from the y1, y2 interval. A linear function is preferred for this penalty.

The penalty functions are summed, and the y coordinates of all jogs may be altered to minimize the overall penalty.

At step 20, x coordinates are assigned to the vertical segments. The vertical segments are defined as "left", "right" or "either". A "left" segment is one that is to the left of some other segment. Segments 50 and 60 in FIGS. 2 and 5 are "left" segments. A "right" segment is one that is to the right of some other segment. Segment 58 in FIG. 4 is a "right" segment. An "either" segment is one that creates no potential conflict with another segment. In FIG. 6, segment 72 is a "left" segment and segment 74 is a "right" segment.

The x-coordinates of the vertical segments are identified by sorting the segments to deal with one or the other of "left" and "right" segments, followed by "either" segments and then followed by the other of "right" and "left". Treating "left" segments as the first, each vertical "left" segment is placed on the left-most available grid. If no such grid line is available, the width of the channel is extended by one grid and attempt is made to place the segment on a new grid. The grid line is available if there are no conflicts with another net along the length of the vertical segment, taking into account separation rules. After the "left" segments are identified, the x-coordinates of the "either" vertical segments are identified, followed by the "right" segments. If the process is accomplished starting with the "right" segments, then each vertical "right" segment is placed on the right-most available grid and the process continues toward the left, as previously described.

At step 22, the required buffers are identified, together with their ideal position and range. This takes into account the timing requirements to identify the approximate places where buffers would be required. Such a position is characterized by the ideal y-coordinate, the allowed distance from the ideal y-coordinate (range) and the vertical segment that is to be broken by the buffer. For example, if segment 50 in FIG. 2 is to be broken by a buffer, the resulting y coordinate of the buffer must be on a grid reserved for the buffer, with only that one buffer on that one grid reserved for it.

At step 24, the actual positioning of the buffers is accomplished, based on the ideal positions. This is treated as an assignment problem of placing the buffers (as objects) at horizontal grid lines (as boxes) to minimize the penalty function. If the capacity of a line is "1", it is reserved for buffers. Otherwise, grid lines not reserved for buffers are "0". The penalty increases as the position of the grid line to the buffer is placed further from the ideal y-coordinate, and is infinity if the grid line is outside the allowed distance from the ideal coordinate or outside the vertical segment. The penalty increases as a quadratic function, and the solution is the placement of the buffers and grid lines to minimize the overall penalty function. As a result the buffers are positioned in optimal locations. After the buffers are placed, the vertical channels are extended to the y-coordinate of the buffer, with jogs as necessary.

In some cases, it may be necessary to sort the buffers according to the x-coordinate of the corresponding vertical segment and solve the assignment problem, as heretofore described, for subchannels consisting of buffers whose x-coordinate is less than some $X_0$. Using the largest $X_0$, a column of buffers is constructed. The process is then repeated for that part of the channel from $X_0$ to the end, resulting in several potential columns of buffers. Buffers are then placed at their positions, the vertical lines are broken and horizontal lines to make connection are accomplished.

The invention is preferably carried out though use of a computer programmed to carry out the process. A computer readable program code is embedded in a computer readable storage medium, such as a disk drive, and contains instructions that cause the computer to carry out the steps of the process. More particularly, code causes the computer to reserve grid positions for buffers, create jogs and vertical segments, assign y-coordinates to jogs and x-coordinates to vertical segments, and assign connections to buffers with minimized penalty. The result is a netlist that differs from the original by the inclusion of buffers and their position to accommodate technology restrictions.

Although the present invention has been described for the situation where the channel is vertical, an analogous process is performed if the channel is horizontal. The process of the invention provides for channel routing without repetitive trial layouts that prior processes required and without detailed knowledge of technology restrictions associated with the fabrication process. The process is simple to use and allows for channel routing of IC netlists transmitted electronically from the designer to the fabricator.

Although the present invention has been described with reference to preferred embodiments, workers skilled in the art will recognize that changes may be made in form and detail without departing from the spirit and scope of the invention.

What is claimed is:

1. A process for routing channels in an integrated circuit layout comprising steps of:
    a) defining a grid having first and second orthogonal coordinate types, netlists, a channel dimension defined by coordinates of a first type, timing requirements and technology restrictions for a plurality of cells of the integrated circuit;
    b) reserving grid positions for buffers;
    c) identifying pins of a cell at different coordinates of the first type to be connected by the channel;
    d) identifying whether a jog is required between vertical segments, and assigning a coordinate of the first type to each such jog;
    e) assigning a coordinate of the second type to each channel segment extending in a direction crossing plural coordinates of the first type; and
    f) assigning coordinates of the first type to buffers to be connected to the channel.

2. The process of claim 1, wherein step (c) includes steps of:
    c1) ordering the pins to be connected to the channel in accordance with the coordinates of the first type, and
    c2) defining a length of the channel in a direction crossing plural first coordinates between the coordinates of the pins to be connected to the channel.

3. The process of claim 1, wherein step (d) includes steps of:
    d1) identifying whether first and second pins of one or more netlists of other cells have the same coordinates of the first type as at least two pins of the cell under consideration to be connected to opposite sides of the channel.

4. The process of claim 3, wherein step (d) further includes steps of:

d2) assigning a first coordinate of the second type to a first channel segment extending in a direction crossing plural coordinates of the first type to satisfy the technology restrictions with respect to the first pin;
    d3) assigning a second coordinate of the second type to a second channel segment extending in a direction crossing plural coordinates of the first type to satisfy the technology restrictions with respect to the second pin; and
    d4) assigning a coordinate of the first type to a third channel segment normal to the first and second channel segments and extending between the first and second segments to satisfy the technology restrictions with respect to the first and second pins.

5. The process of claim 1, wherein step (e) includes steps of:
    e1) assigning a first designation to all segments crossing plural coordinates of the first type that are to a first side of another segment,
    e2) assigning a second designation to all segments crossing plural coordinates of the first type that are to a second side, opposite to the first side of another segment,
    e3) assigning a third designation to all segments crossing plural coordinates of the first type that are not to either side of another segment,
    e4) assigning coordinates of the second type to each segment having the first designation, followed by each segment having the third designation, followed by each segment having the second designation.

6. The process of claim 1, wherein step (f) includes steps of:
    f1) identifying if a segment under consideration that crosses coordinates of the second type also crosses a coordinate of a reserved grid,
    f2) coupling a buffer to the segment identified in step (f1),
    f3) if the segment under consideration does not cross the coordinate of the reserved buffer, extending the segment to the coordinate of the reserved buffer,
    f4) assigning a penalty to each segment extended in step (f3) based on the length of the extension, and
    f5) ordering the buffers and segments to minimize the total penalty.

7. A computer usable medium having a computer readable program embodied therein for addressing data, the computer readable program in the computer usable medium comprising:
    first computer readable program code defining a grid having first and second orthogonal coordinate types, netlists, a channel dimension defined by coordinates of a first type, timing requirements and technology restrictions for a plurality of cells of the integrated circuit;
    second computer readable program code for causing a computer to reserve grid positions for buffers;
    third computer readable program code for causing the computer to identify pins of a cell at different coordinates of the first type to be connected by the channel;
    fourth computer readable program code for causing the computer to identify whether a jog is required between vertical segments, and to assign a coordinate of the first type to each such jog;
    fifth computer readable program code for causing the computer to assign a coordinate of the second type to each channel segment extending in a direction crossing plural coordinates of the first type; and sixth computer readable program code for causing the computer to assign coordinates of the first type to buffers to be connected to the channel.

8. The computer usable medium of claim 7, wherein the third computer readable program code includes:

computer readable program code for causing the computer to order the pins to be connected to the channel in accordance with the coordinates of the first type, and computer readable program code for causing the computer to define a length of the channel in a direction crossing plural first coordinates between the coordinates of the pins to be connected to the channel.

9. The computer usable medium of claim 7, wherein the fourth computer readable program code includes:

computer readable program code for causing the computer to identify whether first and second pins of one or more netlists of other cells have the same coordinates of the first type as at least two pins of the cell under consideration to be connected to opposite sides of the channel.

10. The computer usable medium of claim 9, wherein the fourth computer readable program code further includes:

computer readable program code for causing the computer to assign a first coordinate of the second type to a first channel segment extending in a direction crossing plural coordinates of the first type to satisfy the technology restrictions with respect to the first pin;

computer readable program code for causing the computer to assign a second coordinate of the second type to a second channel segment extending in a direction crossing plural coordinates of the first type to satisfy the technology restrictions with respect to the second pin; and computer readable program code for causing the computer to assign a coordinate of the first type to a third channel segment normal to the first and second channel segments and extending between the first and second segments to satisfy the technology restrictions with respect to the first and second pins.

11. The computer usable medium of claim 7, wherein the fifth computer readable program code includes:

computer readable program code for causing the computer to assign a first designation to all segments crossing plural coordinates of the first type that are to a first side of another segment, computer readable program code for causing the computer to assign a second designation to all segments crossing plural coordinates of the first type that are to a second side, opposite to the first side of another segment, computer readable program code for causing the computer to assigning a third designation to all segments crossing plural coordinates of the first type that are not to either side of another segment, computer readable program code for causing the computer to assign coordinates of the second type to each segment having the first designation, followed by each segment having the third designation, followed by each segment having the second designation.

12. The computer usable medium of claim 7, wherein the sixth computer readable program code includes:

computer readable program code for causing the computer to identify if a segment under consideration that crosses coordinates of the second type also crosses a coordinate of a reserved grid, computer readable program code for causing the computer to couple a buffer to the identified segment, computer readable program code for causing the computer to extend the segment to the coordinate of the reserved buffer if the segment under consideration does not cross the coordinate of the reserved buffer, computer readable program code for causing the computer to assigning a penalty to each extended segment based on the length of the extension, and computer readable program code for causing the computer to order the buffers and segments to minimize the total penalty.

13. Apparatus for routing channels in an integrated circuit layout comprising steps of:

input means for defining a grid having first and second orthogonal coordinate types, netlists, a channel dimension defined by coordinates of a first type, timing requirements and technology restrictions for a plurality of cells of the integrated circuit;

reserving means for reserving grid positions for buffers;

first identifying means for identifying pins of a cell at different coordinates of the first type to be connected by the channel;

second identifying means for identifying whether a jog is required between vertical segments;

first assigning means responsive to the second identifying means for assigning a coordinate of the first type to each jog;

second assigning means for assigning a coordinate of the second type to each channel segment extending in a direction crossing plural coordinates of the first type; and third assigning means for assigning coordinates of the first type to buffers to be connected to the channel.

14. The apparatus of claim 13, wherein the first identifying means includes:

means for ordering the pins to be connected to the channel in accordance with the coordinates of the first type, and means for defining a length of the channel in a direction crossing plural first coordinates between the coordinates of the pins to be connected to the channel.

15. The apparatus of claim 13, wherein the second identifying means includes:

means for identifying whether first and second pins of one or more netlists of other cells have the same coordinates of the first type as at least two pins of the cell under consideration to be connected to opposite sides of the channel.

16. The apparatus of claim 15, wherein the first assigning means includes:

fourth assigning means for assigning a first coordinate of the second type to a first channel segment extending in a direction crossing plural coordinates of the first type to satisfy the technology restrictions with respect to the first pin;

fifth assigning means for assigning a second coordinate of the second type to a second channel segment extending in a direction crossing plural coordinates of the first type to satisfy the technology restrictions with respect to the second pin; and sixth assigning means for assigning a coordinate of the first type to a third channel segment normal to the first and second channel segments and extending between the first and second segments to satisfy the technology restrictions with respect to the first and second pins.

17. The apparatus of claim 13, wherein the second assignment means includes:

seventh assigning mean for assigning a first designation to all segments crossing plural coordinates of the first type that are to a first side of another segment, eighth assigning means for assigning a second designation to all segments crossing plural coordinates of the first type that are to a second side, opposite to the first side of another segment, ninth assigning means for assigning a third designation to all segments crossing plural coordinates of the first type that are not to either side of another segment, tenth assigning means for assigning coordinates of the second type to each segment having the first designation, followed by each segment having the third designation, followed by each segment having the second designation.

18. The apparatus of claim 13, wherein the third assigning means includes:

third identifying means for identifying whether a segment under consideration that crosses coordinates of the second type also crosses a coordinate of a reserved grid, means responsive to the third identifying means identifying that the segment crosses a coordinate of a reserved grid for coupling a buffer to the identified segment, means responsive to the third identifying means identifying that the segment does not cross a coordinate of the reserved buffer for extending the segment to the coordinate of the reserved buffer, means for assigning a penalty to each extended segment based on a length of the extension, and means for ordering the buffers and segments to minimize a penalty.

* * * * *